(12) United States Patent
Lojek

(10) Patent No.: US 7,020,020 B1
(45) Date of Patent: Mar. 28, 2006

(54) LOW VOLTAGE NON-VOLATILE MEMORY CELLS USING TWIN BIT LINE CURRENT SENSING

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 7 days.

(21) Appl. No.: 10/946,728

(22) Filed: Sep. 21, 2004

(51) Int. Cl.
 *G11C 16/04* (2006.01)
(52) U.S. Cl. .......................... 365/185.18; 365/185.01; 365/185.05; 365/185.26
(58) Field of Classification Search .......... 365/185.18, 365/185.01, 185.05, 185.26
See application file for complete search history.

(56) References Cited

U.S. PATENT DOCUMENTS

| | | | |
|---|---|---|---|
| 4,334,292 A | 6/1982 | Kotecha | 365/182 |
| 4,432,075 A | 2/1984 | Eitan | 365/185 |
| 4,821,236 A | 4/1989 | Hayashi et al. | 365/185 |
| 4,982,377 A * | 1/1991 | Iwasa | 365/185 |
| 5,640,344 A * | 6/1997 | Pani et al. | 365/182 |
| 6,002,610 A * | 12/1999 | Cong et al. | 365/185.05 |
| 6,125,053 A | 9/2000 | Diorio et al. | 365/185.03 |
| 6,563,736 B1 * | 5/2003 | Hsu et al. | 365/185.18 |

* cited by examiner

*Primary Examiner*—Connie C. Yoha
(74) *Attorney, Agent, or Firm*—Schneck & Schneck; Thomas Schneck

(57) ABSTRACT

A non-volatile memory cell operating at low voltage by means of impact ionization for programming. Impact ionization arises from a charge injector, such as a diode, created in the substrate of a floating gate charge storage transistor. The charge supply is biased by push-pull voltages applied to the charge storage transistor, while another floating gate transistor assists in reading the charge state of the charge storage transistor. The other transistor switches current from a sense transistor associated with a sense line, the current switching between two bit lines depending on the charge state of the charge storage transistor. In other words, the switched current appears in one of two bit lines, one bit line indicating stored charge and the other indicating the absence of stored charge, i.e. digital zero and one, positively indicated in the two bit lines.

21 Claims, 5 Drawing Sheets

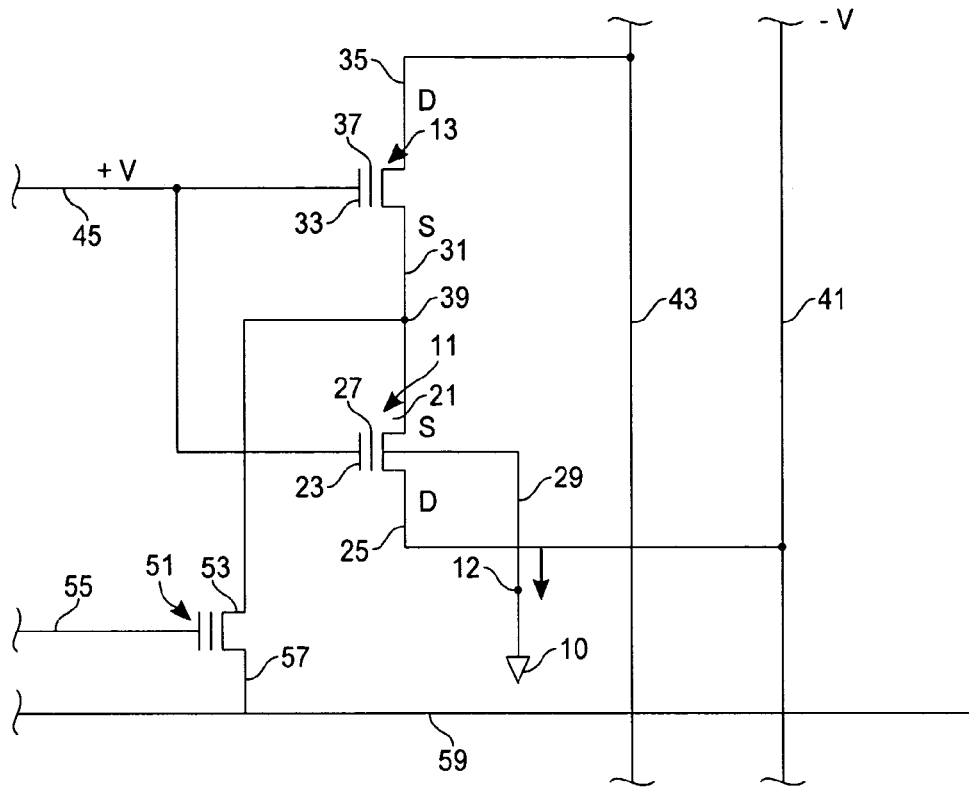
Fig._1
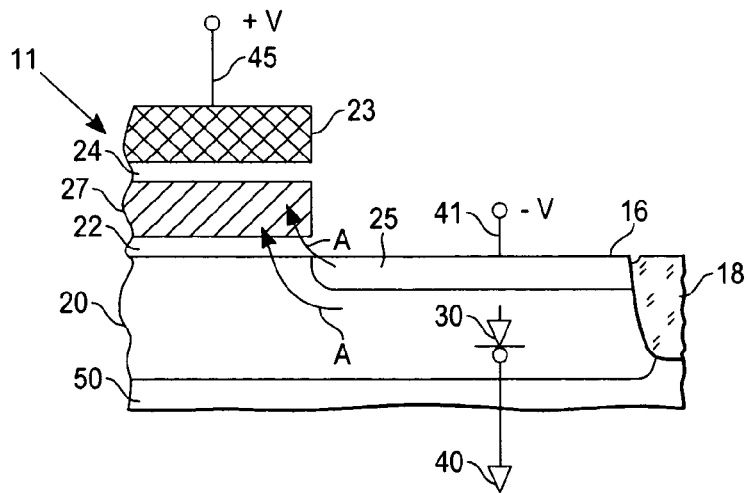
Fig._2

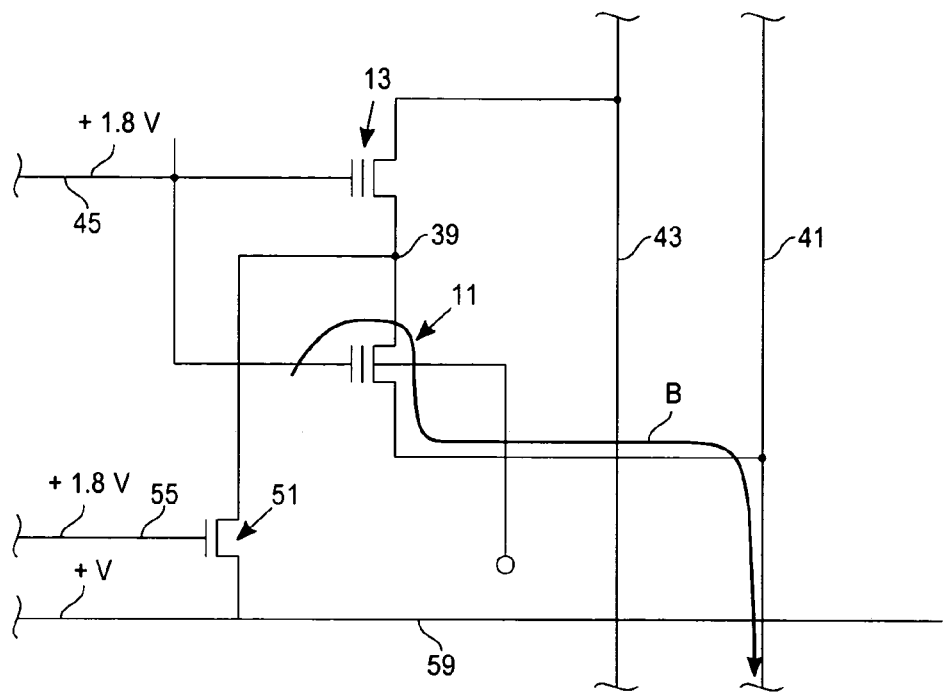
*Fig._3*
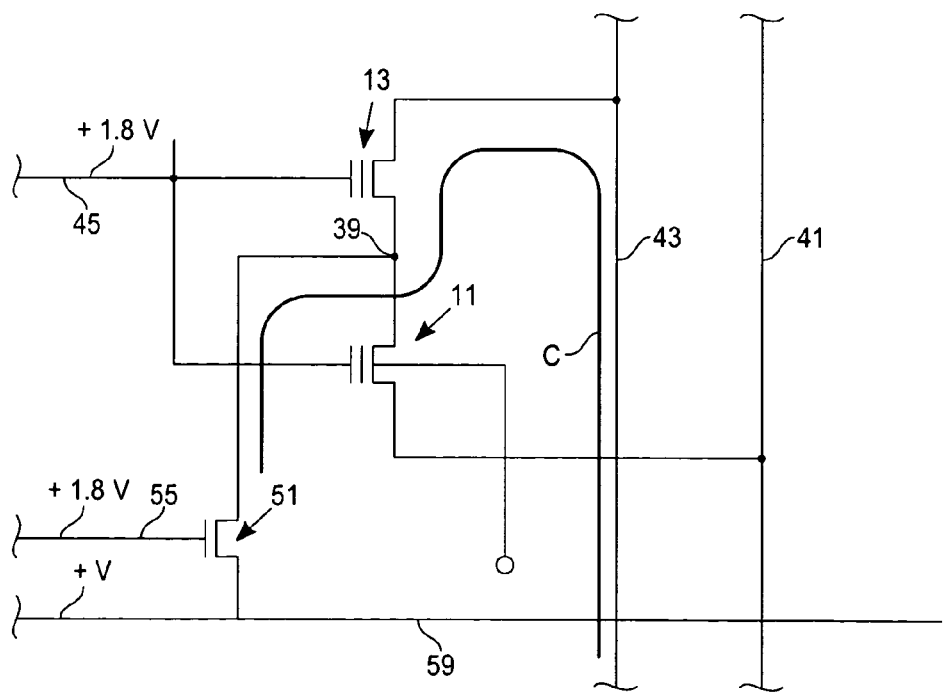
*Fig._4*

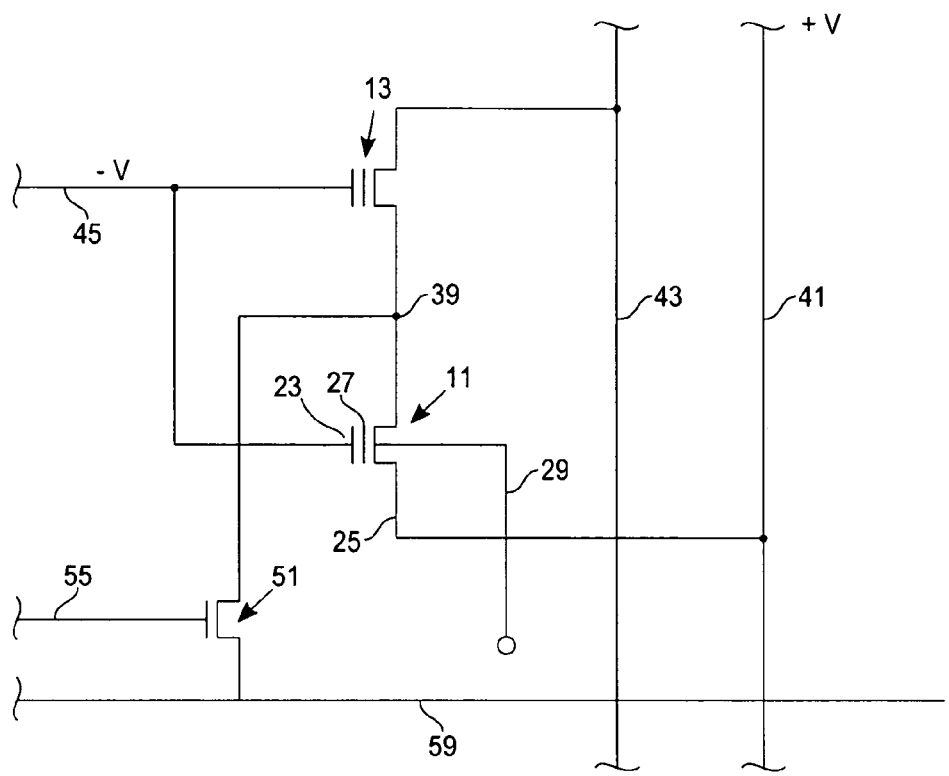
*Fig._ 5*
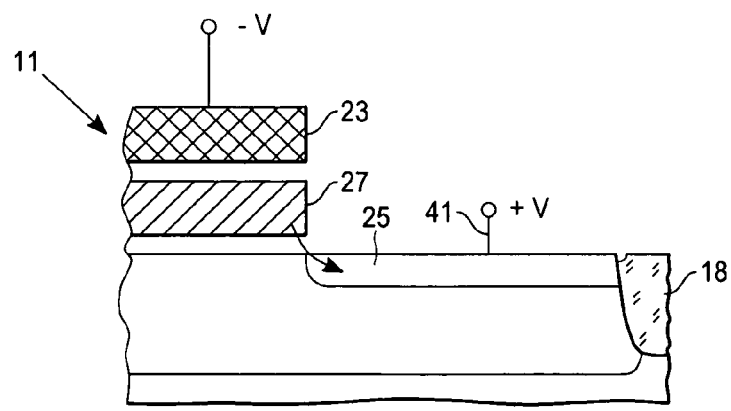
*Fig._ 6*

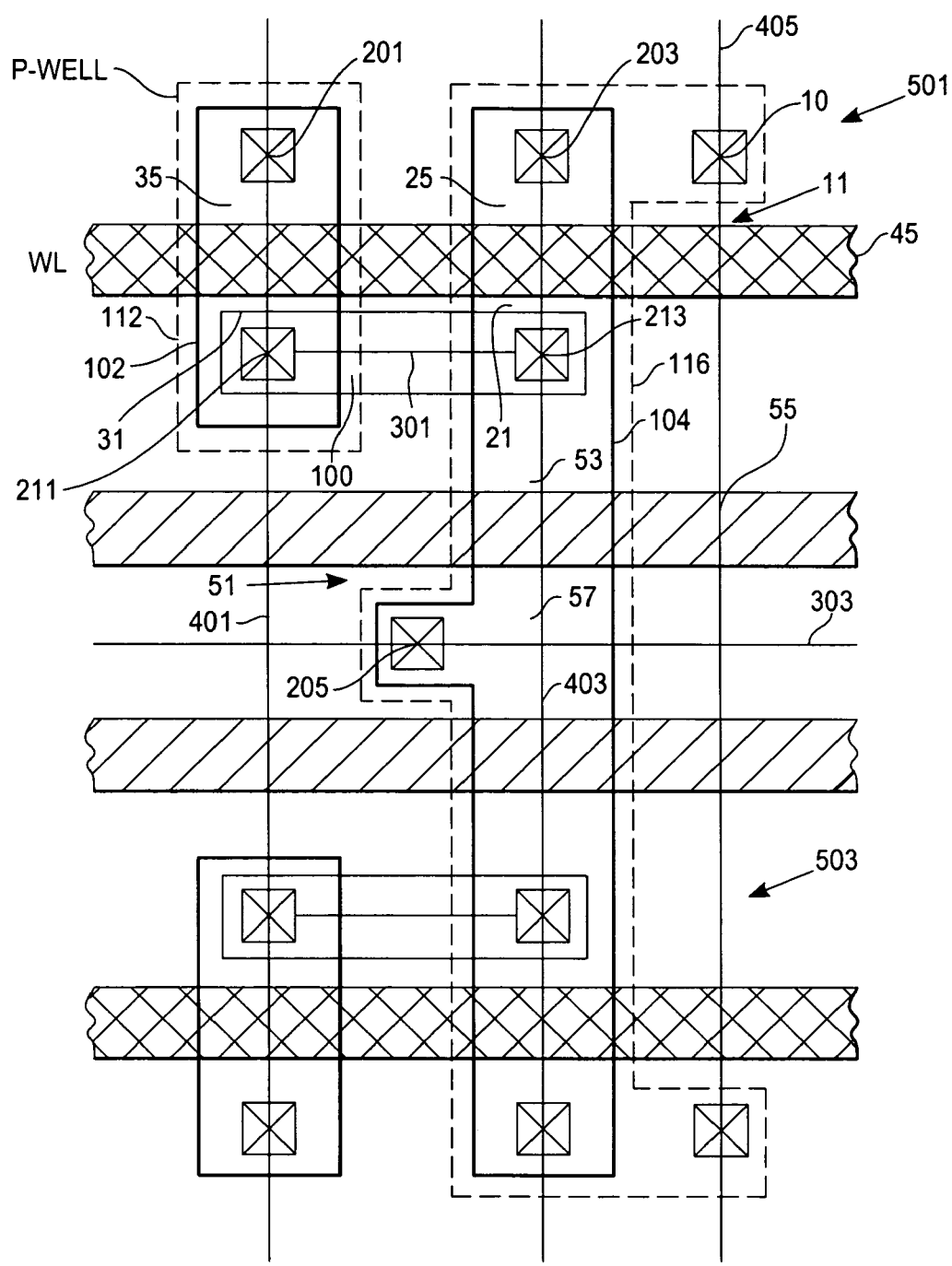
Fig. _7

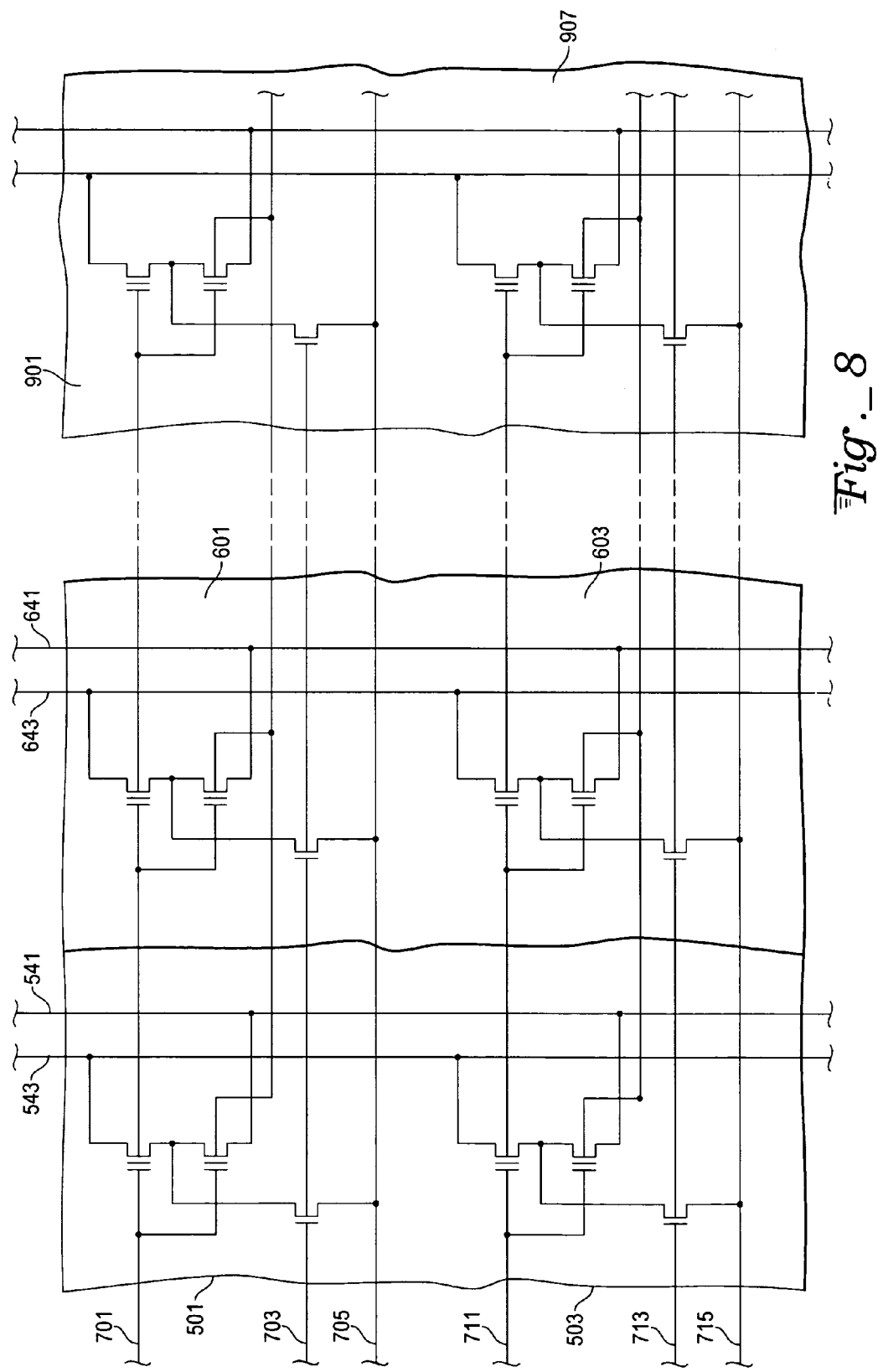
Fig._8

LOW VOLTAGE NON-VOLATILE MEMORY CELLS USING TWIN BIT LINE CURRENT SENSING

TECHNICAL FIELD

The invention relates to non-volatile memory transistors and, in particular, to non-volatile memory cells operating at low voltage.

BACKGROUND ART

Impact ionization has been known for several years. U.S. Pat. No. 4,432,075 to B. Eitan and U.S. Pat. No. 4,821,236 to Hayashi et al. describe an EEPROM transistor adjacent to a charge generator, creating a substrate current near the EEPROM, creating excess charge or holes, resembling space charge, near subsurface electrodes of the EEPROM. Assume that the holes are generated and accelerated toward one of the electrodes of the EEPROM. Resulting secondary electrons are sufficiently energetic to penetrate gate oxide over the substrate and become injected into a conductive floating gate. For EEPROMs, the floating gate becomes charged by band-to-band tunneling, a situation which eliminates the need for a control gate over the floating gate. It is known that EEPROMs using impact ionization require lower voltages for programming and erasing compared to conventional EEPROMs that can require 12 volts or more for programming.

U.S. Pat. No. 4,334,292 discloses a non-volatile memory cell employing at least two bit lines for programming and reading the cell. Charge injector regions are employed to reduce voltage supply levels for the memory cell.

U.S. Pat. No. 4,821,236 shows a subsurface injector region that generates charge for storage on a floating gate of a non-volatile memory cell. See also U.S. Pat. No. 6,125,053 regarding impact ionization.

One of the problems encountered in manufacturing EEPROMs is generating the high voltages required for programming. Where only low voltages are available, charge pumps, or the like, are typically employed to supply internal programming voltages. Charge pumps occupy valuable die area and require ancillary timing circuits for operating switches associated with the charge pumps. In turn, the timing circuits can require adjustment, needing other ancillary circuits. Similarly, circuits for reading EEPROMs require high voltages on control gates to drive charge from floating gates. Voltage must be high enough to obtain sufficient current flow that can be read. Once again, voltage increasing circuits must be used where only low voltage power supplies are employed.

An object of the invention was to devise an EEPROM architecture operating on very low voltages, yet not employing charge pumps or the like.

SUMMARY OF THE INVENTION

The above object has been achieved with an EEPROM transistor that can be programmed and read with very low voltages in metal-oxide-semiconductor (MOS) technology, the read operation using two parallel bit lines, one signalling digital one and the other signalling digital zero. Charge storage is stimulated in this environment by creating a virtual diode, formed by reverse biasing of a source or drain of a PMOS transistor, or an NMOS transistor in a P-well, establishing a polarity that allows electrons to emerge from the source or drain having a current flowing to the substrate and elsewhere. This reverse biasing is an effective p-n junction, similar to a virtual diode and a counterflow of holes that impinge upon the source or drain, giving rise to free electrons. Some of these electrons are pushed toward a control gate above a floating gate. At the same time, a charge attractive low voltage on the control gate pulls charge onto the floating gate where it is stored, indicative of a data state, such as a 1 or 0, providing a novel push-pull bias voltage arrangement.

To erase the charge storage transistor, an opposite voltage is applied to the control gate which drives charge from the floating gate into the grounded substrate. To read the charge storage transistor a second transistor is required, acting as a switch, and a third transistor that acts as a sense transistor. When the charge storage transistor is charged, the channel of the switch transistor will block conduction from the sense transistor and current flows through the switch transistor into a first bit line. When the charge storage transistor is not charged, the channel of the storage transistor is available for conduction and current from the select transistor flows through the charge storage transistor into a second bit line. Accordingly, a current pulse in the first bit line indicates that the storage transistor is charged, signalling a first data state, while a current pulse in the second bit line indicates no charge in the storage transistor, indicative of a second data state.

The charge storage and switch transistors are constructed similarly but only one transistor is charged because it has a subsurface p-n junction used for charging the cell. The switch transistor, while appearing to have a floating gate, uses the apparent floating gate to attenuate control gate voltage on the channel. There is enough voltage influence on the channel of the switch transistor to allow conduction when the channel of the charge storage transistor is blocked by charge on its floating gate. There is no charge storage on the floating gate of the switch transistor. Since the floating gate of the switch transistor is floating, it will communicate an electric field from the control gate to the channel to govern the switching characteristic of the transistor. With small geometries, all bias voltages are 3.0 volts or less and preferably below 2.5 volts and with ultra small geometries below 2.0 volts.

BRIEF DESCRIPTION OF THE DRAWINGS

FIG. 1 is a schematic diagram of a memory cell of the present invention with programming voltages applied.

FIG. 2 is a side sectional cutaway view of a floating gate charge storage transistor biased for charge storage by impact ionization in the memory cell shown in FIG. 1.

FIG. 3 is a schematic diagram of a memory cell shown in FIG. 1 illustrating a current path for reading the floating gate charge storage transistor of FIG. 2 when it is charged.

FIG. 4 is a schematic diagram of a memory cell shown in FIG. 1 illustrating a current path for reading the floating gate charge storage transistor of FIG. 2 when it is not charged.

FIG. 5 is a schematic diagram of a memory cell as shown in FIG. 1 but with erase voltages applied.

FIG. 6 is a view similar to FIG. 2 except biased for erasing in the memory cell shown in FIG. 5.

FIG. 7 is a top plan view of a memory cell shown in FIG. 1 except without applied voltages.

FIG. 8 is a memory array with rows and columns of memory cells as shown in FIG. 1 but without applied voltages.

BEST MODE FOR CARRYING OUT THE INVENTION

With reference to FIG. 1, two CMOS floating gate transistors are shown, including a first floating gate transistor 11 and a second floating gate transistor 13. Transistor 11 has a source 21, a control gate 23, a drain 25, and a floating gate 27. Transistor 13 has a source 31, a control gate 33, a drain 35, and a floating gate 37.

Drain 25 of first transistor 11 is electrically connected to bit line 41 that runs through all memory cells in a column of a memory array. Control gate 23 is connected to word line 45 and also to control gate 33 of second transistor 13. Source 21 of first transistor 11 is connected to source 31 of second transistor 13 and to the source 53 of CMOS transistor 51 at node 39. The control gate 55 of CMOS transistor 51 is a select line for the memory array. A drain 57 of CMOS transistor 51 is connected to a sense line 59 running through a memory array of cells of the kind shown in FIG. 1 in a direction parallel to rows of the memory cells. An n-well in which the p-type transistors are built serves as a grounding point 10 with a ground terminal 12.

Second floating gate transistor 13 has its drain electrode 35 connected to bit line 43. The two bit lines 41 and 43 are parallel and are each connected to a drain electrode of one of the floating gate transistors 11 and 13, respectively. In the program and erase modes of operation, the bit lines are used to apply bias. In the read mode of operation, the bit lines signal the presence and absence of charge on the charge storage floating gate transistor 11. FIG. 1, showing the program mode of operation, has negative voltage, −V, on bit line 41 and positive voltage, +V, on word line 45. Sense line 59 is floating. The only requirement on voltage V is that it exceed the threshold voltage of the CMOS transistors.

Both floating gate transistors 11 and 13 are manufactured similarly and simultaneously. Both employ a stripe of poly 1 for the floating gates. In insulated relation above the floating gate stripe is a stripe of poly 2 for the control gates. In use, floating gate transistor 11 is used for charge storage and floating gate transistor 13 is not. The charge storage aspect of floating gate transistor 11 arises from grounding the substrate of floating gate transistor 11, or otherwise applying a $V_{DD}$ voltage at node 12 to cause electron flow out of the drain. This electron flow simulates a diode, termed a virtual diode, that arises from the p-n junction stimulated by the negative voltage, −V, applied to the p-type drain 25, sweeping electrons out of the drain region. The existence of such diodes in PMOS transistors biased by a negative drain voltage is known as PMOS enhancement transistor action. When transistor dimensions are reduced to micron size dimensions, electrons not only flow to ground but are influenced by a positive control gate voltage, +V, on control gate 23.

In FIG. 2, the control gate 23 in PMOS transistor 11 has a positive voltage, +V, applied to word line 45. A negative voltage, −V, is applied on bit line 41 to subsurface drain electrode 25 driving off electrodes, thereby making the region p+. A virtual diode 30 exists between ground 40 and drain 25. Drain 25 is bounded by isolation region 18 and upper surface 16 of the n-well below where the drain 25 resides. Electrons are swept out of the n-well 20 and flow through the diode 30 toward ground 40. Some electrons in n-well 20, as well as drain 25, experience an electric field from the positive voltage applied to word line 45. This causes electron injection into the thin oxide insulation layer 22, typically a very thin oxide layer resembling tunnel oxide, with electrons moving on to floating gate 27, as indicated by arrows A.

Note that transistor 13 in FIG. 1 has no similar negative voltage applied on bit line 43 and so drain 35 does not form a virtual diode. Returning to FIG. 2, the floating gate 27 is spaced from the control gate 23 by an insulative layer 24. Control gate 23 is conductive, preferably made of poly, i.e. a poly 2 layer. The floating gate 27 is also made of poly, i.e. a poly 1 layer. Transistor 13 is fabricated similarly. In summary, when a negative voltage, −V, is applied to bit line 41 and a positive voltage, +V, is applied to word line 45, charge flows across thin oxide layer 22 onto floating gate 27. Charge on floating gate 27 indicates a logic state, such as a digital zero or a digital one. The charge flow mechanism can be hot electron transfer, Fowler-Nordheim tunneling, or band-to-band tunneling. Electrons are available as space charge generated as a result of impact ionization. Hot electrons may have enough kinetic energy to overcome the tunnel barrier and move onto the floating gate, accelerated by the positive voltage, +V, on control gate 23 such that penetration of oxide layer 22 occurs moving the electrons onto floating gate 27. Other tunneling mechanisms can be simultaneously operative.

In FIG. 3, reading of the floating gate charge storage transistor is illustrated in the situation where there is charge stored on the floating gate charge storage transistor. A low positive voltage, approximately 1.8 volts, is applied to word line 45 and select line 45. A positive voltage above threshold, +V, is applied momentarily to line 59. This causes select transistor 51 to conduct current toward node 39. Charge on the floating gate charge storage transistor draws holes into the channel of transistor 11 causing transistor 11 to conduct into bit line 41, indicated by path B. Thus, current in bit line 41 occurring after pulsing sense line 59 with a positive voltage, indicates that floating gate charge storage transistor 11 is charged. Note that switching transistor 13 is a high resistance path to current flow compared to path B.

When the floating gate charge storage transistor is not charged and the same voltages are applied to lines 45, 55 and 59, then the floating gate charge storage transistor is essentially open because the channel does not permit conduction. Conduction by select transistor 51 causes the voltage at node 39 to be almost the same as the voltage on select line 55. This voltage, say +1.8 V, is about the same as the voltage applied to word line 45. Voltage on word line 45 induces a similar voltage on floating gate of switching transistor 13, creating a conductive channel into the floating bit line 43, with current flow indicated by the path C. Switching transistor 13 now provides a low resistance path for current while the current path through the floating gate charge storage transistor 11 is blocked. Current in bit line 43 occurring after sense line 59 is pulsed with a positive voltage indicates that the floating gate charge storage transistor 11 is not charged.

An erase operation is illustrated in FIG. 5 where negative voltage, −V, is applied to word line 45 and positive voltage, +V, is applied to bit line 41. Positive voltage on drain 25, coupled with an equal negative voltage on control gate 25 pulls stored charge off of floating gate 27. Select transistor 51, together with select line 55 and sense line 59 are inactive and so is bit line 43. Switching transistor 13 is off.

FIG. 6 illustrates the bit line 41 with the voltage +V pulling electrons into drain 25 from a floating gate 27 with the voltage −V simultaneously pushing electrons away from control gate 23 toward drain 25. This discharges the floating gate of transistor 13, thereby erasing the cell in a push-pull manner.

In FIG. 7 the solid rectangular lines 102 and 104 are subsurface active areas, on the order of a few microns in width, that are doped N-well regions in a P substrate. The P+ diffusions in the N-well regions are shown by numbers, i.e. sources and drains, but not lines. The dashed lines 112, 116 are STI isolation regions.

The double hatched horizontal stripe 45 is the cell word line formed by a poly 2 stripe spaced apart by an insulative layer over a poly 1 stripe that is floating gates 37 and 27 in FIG. 1. The poly 2 stripe acts as control gates 23 and 33 in FIG. 1. The floating gate charge storage transistor 11 has a drain region 25 and a source region 21. A via 10 extends from an upper metal layer 1 to contact a subsurface N-well for forming a p-n junction to establish impact ionization. Switching transistor 13 has a drain region 35 and a source region 31. Contacts 203 and 201 form portions of bit lines 43 and 41, respectively, in FIG. 1. A poly 1 conductive strap 100 ties together sources 21 and 31.

A horizontal poly 1 stripe 55 is the select line for select transistor 51 having a source region 53 and a drain region 57. A via 205 from metal layer 1 to the drain region 57 establishes sense line 59 in FIG. 1. A first metal layer 1 portion is represented by horizontal line 301 connecting vias 211 and 213 forming node 39 in FIG. 1, joining sources 21 and 31. A second metal layer 1 portion, not connected to the previously mentioned first metal layer 1 portion, is represented by horizontal line 303 serving as sense line 59 in FIG. 1.

A first metal layer 2 portion is represented by vertical line 401, making contact with via 201 to communicate bit line 43. A second metal-layer 2 portion is represented by vertical line 403, making contact with via 203 to communicate bit line 41. A third metal layer 2 portion is represented by vertical line 405, making contact with via 10 to establish p-n junctions for impact ionization. The first, second and third metal layer portions are not connected, but fabricated at the same time.

In the lower half of FIG. 7, the memory cell 503 is a vertical mirror image of memory cell 501 in the upper half of FIG. 7. The mirror image is formed across the shared sense line 303 with otherwise identical construction.

Mirror image memory cells 501 and 503 are shown in FIG. 8, adjacent to corresponding cells 601 and 603 and in an array with further corresponding cells 901 and 903. The cells 501, 601 and 901 share word lines 701, select line 703 and sense line 705. Cells 503, 603 and 903 share word line 711, select line 713 and sense line 715. Memory cells 501 and 503 share bit lines 541 and 543 while memory cells 601 and 603 share bit lines 641 and 643. The memory cells in the array are seen to employ three transistors, all fabricated at the same time using a stripe geometry.

What is claimed is:

1. A low voltage, non-volatile memory cell comprising, first and second bit line means for signalling memory cell output, including a first bit line signalling a first memory state and a second bit line signalling a second memory state,
a floating gate charge storage transistor capable of communicating current to the first and second bit lines, and
a switch connected between the floating gate charge storage transistor and the bit lines whereby charge on the floating gate charge storage transistor forces the switch to direct current to one of the first and second bit lines and lack of charge on the floating gate charge storage transistor forces the switch to direct current to the other of the first and second bit lines.

2. The memory cell of claim 1 wherein said switch is a floating gate transistor sharing floating poly one and sharing poly two overlying stripes with said floating gate charge storage transistor.

3. The memory cell of claim 2 further defined by a word line means for applying a first low voltage to the control gates of the switch transistor and the charge storage transistor.

4. The memory cell of claim 1 having a subsurface diode means for generating charge for the floating gate charge storage transistor.

5. The memory cell of claim 1 having low voltage push-pull bias means for generating charge for the floating gate charge storage transistor.

6. The memory cell of claim 1 wherein the floating gate charge storage transistor is a CMOS transistor.

7. The memory cell of claim 2 wherein said switch is a CMOS transistor.

8. The memory cell of claim 2 wherein said floating gate charge storage transistor and said switch are CMOS transistors.

9. A low voltage CMOS non-volatile memory cell comprising,
first and second bit line means for signalling memory cell output including a first line signalling a first memory state and a second line signalling a second memory state,
a floating gate charge storage transistor capable of current communication to the first and second bit line means having a substrate with a charge supply in the substrate that can be biased by push-pull voltages applied to the charge storage transistor to stimulate impact ionization, and
a switch connected between the floating gate charge storage transistor and the first and second bit line means,
whereby charge on the floating gate charge storage transistor forces the switch to direct current to one of the first and second bit line means and lack of charge on the floating gate charge storage transistor forces the switch to direct current to the other of the first and second bit line means.

10. The memory cell of claim 9 wherein said switch is a floating gate transistor having a source, drain and control gate and wherein the floating gate charge storage transistor has a source, drain and control gate.

11. The memory cell of claim 10 further defined by a word line means for applying a first low voltage to control gates of the switch transistor and the charge storage transistor.

12. The memory cell of claim 9 further comprising a sense current means for supplying current for reading the state of the charge storage transistor.

13. The memory cell of claim 12 wherein the sense current means comprises a select transistor having source, gate and drain electrodes, with a second low voltage associated with the gate and a third low voltage associated with the source or drain electrodes.

14. The memory cell of claim 10 wherein the floating gate charge storage transistor has a substrate biased relative to one of the source and drain electrodes to cause impact ionization.

15. The memory cell of claim 13 wherein the first, second and third low voltages are all less than 2 volts.

16. A low voltage non-volatile memory cell comprising, first and second MOS floating gate transistors, each transistor having a control gate connected to a common word line, a substrate with connected common subsurface source electrodes and with subsurface drain electrodes connected to first and second bit lines, the first floating gate transistor having the substrate biased to form a virtual diode relative to a source or drain and the control gate having a bias operating in a push-pull relation with the virtual diode for charging the floating gate of the first floating gate charge storage transistor, the second transistor connected to one of the first and second bit lines switching current therebetween depending on charge on the floating gate of the first floating gate charge storage transistor,
  a select transistor connected to the common source electrodes of the first and second floating gate transistors, a second electrode connected to a sense line and a control gate connected to a select line,
  whereby application of voltage to the select line sends current toward the second transistor for switching current between the bit lines.

17. The memory cell of claim 16 wherein the second transistor shares common poly one and poly two overlying stripes with the first transistor.

18. The memory cell of claim 16 having all bias below 3 volts.

19. The memory cell of claim 16 having all bias below 2.5 volts.

20. The memory cell of claim 16 having all bias below 2.0 volts.

21. A floating gate non-volatile memory cell having a word line, a sense line, a select line, and first and second bit lines comprising,
  a first transistor having a substrate with an impact ionization diode therein, the substrate also having a source and drain with a channel therebetween, a floating gate in insulative relation over the channel and a control gate in insulative relation over the floating gate,
  a second transistor having a substrate with source and drain with a channel therebetween, a floating gate in insulative relation over the channel and a control gate in insulative relation over the floating gate, the source of the second transistor connected to the source of the first transistor at a common node, the control gates of the first and second transistors connected to the word line,
  a select transistor having a first electrode connected to said common node, a second electrode connected to the sense line and a control gate connected to the select line,
  whereby application of voltage to the select line sends current toward the second transistor switching current between the bit lines.

* * * * *